US012771383B2

(12) United States Patent
Takezono et al.

(10) Patent No.: US 12,771,383 B2
(45) Date of Patent: Oct. 20, 2026

(54) HIGH-FREQUENCY MODULE

(71) Applicant: Murata Manufacturing Co., Ltd., Kyoto (JP)

(72) Inventors: Naofumi Takezono, Kyoto (JP); Katsuya Ikegami, Kyoto (JP); Wataru Takahashi, Kyoto (JP); Satoshi Sakita, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 18/961,730

(22) Filed: Nov. 27, 2024

(65) Prior Publication Data

US 2025/0183921 A1 Jun. 5, 2025

(30) Foreign Application Priority Data

Dec. 4, 2023 (JP) ................................ 2023-204915

(51) Int. Cl.
*H04B 1/00* (2006.01)
*H03H 11/34* (2006.01)
*H04B 1/40* (2015.01)

(52) U.S. Cl.
CPC ........... *H04B 1/0057* (2013.01); *H03H 11/34* (2013.01); *H04B 1/40* (2013.01)

(58) Field of Classification Search
CPC ........ H04B 1/0057; H04B 1/40; H04B 1/006; H04B 1/44; H04B 1/0064; H04B 1/401; H04B 7/0602; H04B 1/48; H04B 1/406; H04B 1/3827; H04B 1/06; H04B 1/18; H04B 1/38; H04B 1/04; H04B 7/0814; H04B 17/12; H04B 7/0868; H03H 11/34; H04L 5/14
See application file for complete search history.

(56) References Cited

U.S. PATENT DOCUMENTS

| | | | | |
|---|---|---|---|---|
| 9,929,768 B2* | 3/2018 | Li | ............................ | H04L 5/14 |
| 2004/0203552 A1* | 10/2004 | Horiuchi | ................ | H04B 1/406 455/333 |
| 2014/0376417 A1* | 12/2014 | Khlat | .................. | H04B 1/0064 |
| 2022/0149873 A1* | 5/2022 | Yoo | .......................... | H04B 1/48 |
| 2025/0266853 A1* | 8/2025 | Hsu | ........................ | H04B 1/006 |

FOREIGN PATENT DOCUMENTS

| | | |
|---|---|---|
| JP | 2007-512781 A | 5/2007 |
| WO | 2022/145127 A1 | 7/2022 |
| WO | 2022/209751 A1 | 10/2022 |

* cited by examiner

*Primary Examiner* — Lana N Le
(74) *Attorney, Agent, or Firm* — McDonald Hopkins LLC

(57) ABSTRACT

A first circuit that inputs/outputs a first frequency band and a second circuit that inputs/outputs a second frequency band are included. A first receiving unit in the first circuit is connected to a first external connection terminal or a second external connection terminal with a band pass filter and a first switch in a high-frequency switch. A first transmitting unit or a second receiving unit in the first circuit is connected with a second switch in the high-frequency switch. The second switch is connected to a diplexer connected to a third external connection terminal. A second transmitting unit in the second circuit is connected to the diplexer or a fourth external connection terminal with a third switch in the high-frequency switch. A third receiving unit or a fourth receiving unit in the second circuit is connected to the fourth external connection terminal with the third switch.

10 Claims, 7 Drawing Sheets

HIGH-FREQUENCY MODULE

CROSS REFERENCE TO RELATED APPLICATION

This application claims priority from Japanese Patent Application No. 2023-204915 filed on Dec. 4, 2023. The content of this application is incorporated herein by reference in its entirety.

BACKGROUND

The present disclosure relates to a high-frequency module.

In Japanese Unexamined Patent Application Publication (Translation of PCT Application) No. 2007-512781, FIG. 1 illustrates a wireless mobile unit including a UWB (Ultra Wide Band) module and a CDMA (Code Division Multiple Access) module.

BRIEF SUMMARY

The wireless mobile unit described in Japanese Unexamined Patent Application Publication (Translation of PCT Application) No. 2007-512781 includes two modules, thereby increasing the size and cost.

The present disclosure has been made in view of the above. The present disclosure reduces the high-frequency module in size and cost.

A high-frequency module according to an aspect of the present disclosure includes a first circuit configured to input and output a signal of a first frequency band, a second circuit configured to input and output a signal of a second frequency band, the second frequency band being different from the first frequency band, a high-frequency switch, a diplexer, a first external connection terminal and a second external connection terminal, the first external connection terminal and the second external connection terminal being configured to receive signals received from a first antenna and a second antenna, and a third external connection terminal and a fourth external connection terminal, the third external connection terminal and the fourth external connection terminal being configured to receive signals received from a third antenna and a fourth antenna or transmit signals to the third antenna and the fourth antenna. A first receiving unit in the first circuit is selectively connected to either the first external connection terminal or the second external connection terminal with a band pass filter interposed therebetween and then with a first switch in the high-frequency switch interposed therebetween. A first transmitting unit or a second receiving unit in the first circuit is selectively connected with a second switch in the high-frequency switch interposed therebetween. Further, the second switch is connected to the diplexer connected to the third external connection terminal. A second transmitting unit in the second circuit is connected to the diplexer or the fourth external connection terminal with a third switch in the high-frequency switch interposed therebetween. A third receiving unit or a fourth receiving unit in the second circuit is selectively connected to the fourth external connection terminal with the third switch interposed therebetween.

According to the present disclosure, it is possible to reduce the high-frequency module in size and cost.

DETAILED DESCRIPTION

Hereinafter, embodiments of the present disclosure will be described in detail with reference to the accompanying drawings. Note that the present disclosure is not limited to the embodiments. Each of the embodiments is an example, and it is needless to say that the configurations illustrated in different embodiments can be partly replaced or combined. In a second and subsequent embodiments, descriptions of matters common to those in a first embodiment will be omitted, and only different points will be described. In particular, substantially the same functions and effects obtained by substantially the same configurations will not be sequentially described for each embodiment.

First Embodiment

Configuration

Figure 1:
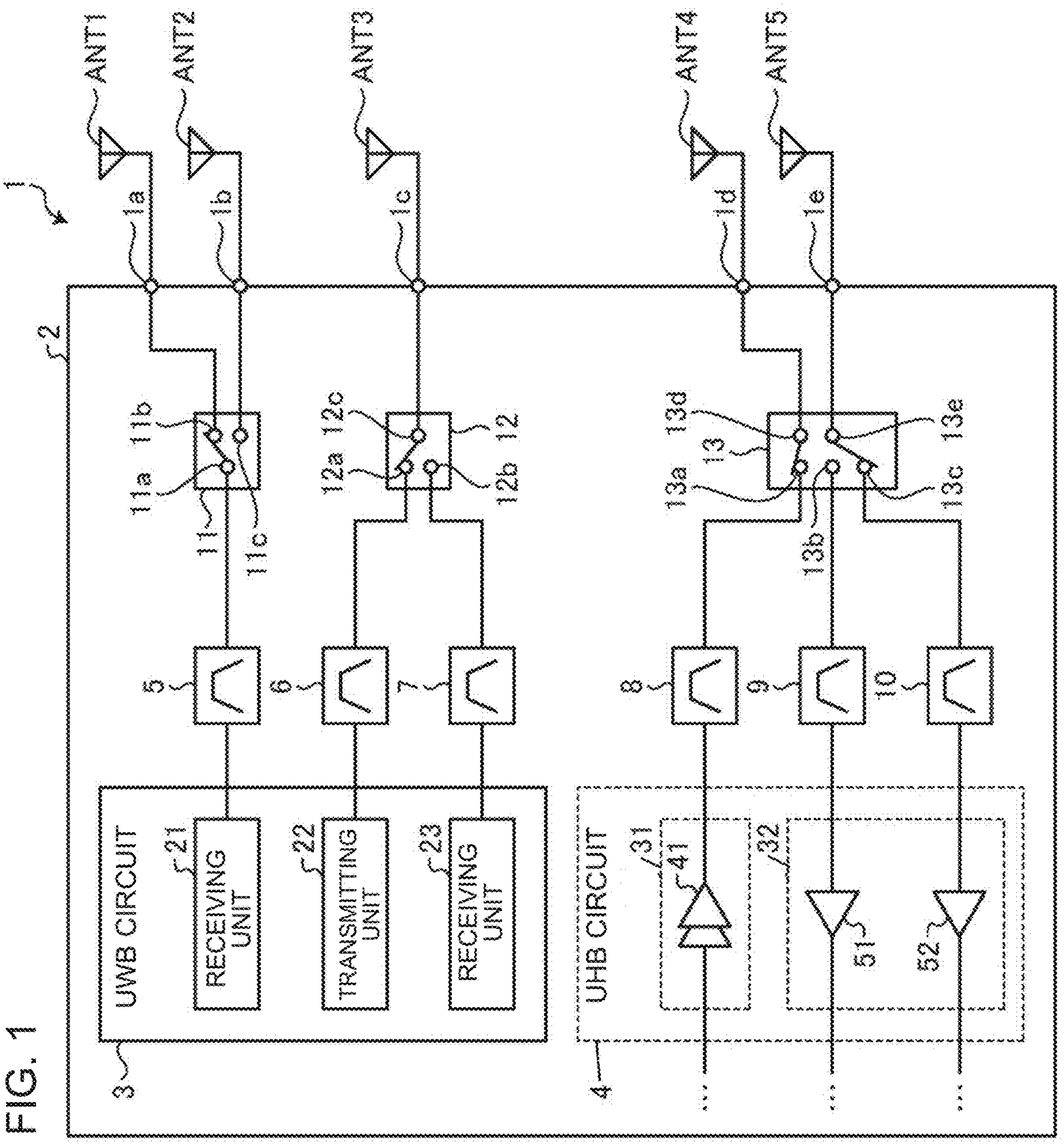
FIG. 1 is a diagram illustrating a configuration of a high-frequency module according to a first embodiment.

FIG. 1 is a diagram illustrating a configuration of a high-frequency module according to the first embodiment. A high-frequency module 1 includes a substrate 2, a UWB (Ultra Wide Band) circuit 3, a UHB (Ultra High Band) circuit 4, band pass filters 5 to 10, and switches 11 to 13. The UWB circuit 3, the UHB circuit 4, the band pass filters 5 to 10, and the switches 11 to 13 are mounted on the substrate 2.

The UWB is defined in IEEE 802.15.4z, for example, and an example of the frequency band is about 6 GHz to 8 GHz, but the present disclosure is not limited thereto. Examples of the UHB are n77, n78, and n79 of 5G NR (5th Generation New Radio), and an example of the frequency band is about 3.3 GHZ to 5 GHz, but the present disclosure is not limited thereto.

The UWB circuit 3 corresponds to an example of a "first circuit" of the present disclosure. The UHB circuit 4 corresponds to an example of a "second circuit" of the present disclosure.

The "second circuit" is the UHB circuit 4 in the first embodiment, but the present disclosure is not limited thereto. The "second circuit" may be, for example, an MHB (Middle High Band) circuit. Examples of the MHB are B39 and B41 of LTE (Long Term Evolution), and an example of the frequency band is about 1.8 GHZ to 2.7 GHZ. The frequency band of a signal that is input to and output from the "second circuit" is, for example, lower than the frequency band of a signal that is input to and output from the "first circuit".

The substrate 2 has terminals 1$a$ to 1$e$. The terminal 1$a$ is electrically connected to an antenna ANT1. The terminal 1$b$ is electrically connected to an antenna ANT2. The terminal 1*c* is electrically connected to an antenna ANT3. The terminal 1*d* is electrically connected to an antenna ANT4. The terminal 1*e* is electrically connected to an antenna ANT5.

The UWB circuit 3 includes a receiving unit 21, a transmitting unit 22, and a receiving unit 23.

The receiving unit 21 corresponds to an example of a "first receiving unit" of the present disclosure. The transmitting unit 22 corresponds to an example of a "first transmitting unit" of the present disclosure. The receiving unit 23 corresponds to an example of a "second receiving unit" of the present disclosure.

The UWB circuit 3 may be a single semiconductor device formed in or on a Si (silicon) substrate.

The UHB circuit 4 includes a transmitting unit 31 and a receiving unit 32. The transmitting unit 31 includes a power amplifier 41. The receiving unit 32 includes a low noise amplifier 51 and a low noise amplifier 52.

The transmitting unit 31 may be a single semiconductor device formed in or on a GaAs (gallium arsenide) substrate. The power amplifier 41 may be an HBT (Heterojunction Bipolar Transistor) formed in or on a GaAs substrate. The receiving unit 32 may be a single semiconductor device formed in or on a Si substrate. Each of the low noise amplifier 51 and the low noise amplifier 52 may be an FET (Field Effect Transistor) formed in or on a Si substrate.

The power amplifier 41 corresponds to an example of a "second transmitting unit" of the present disclosure. The low noise amplifier 51 corresponds to an example of a "third receiving unit" of the present disclosure. The low noise amplifier 52 corresponds to an example of a "fourth receiving unit" of the present disclosure.

The receiving unit 21 is electrically connected to a terminal 11*a* of the switch 11 with the band pass filter 5 interposed therebetween. A terminal 11*b* of the switch 11 is electrically connected to the antenna ANT1 with the terminal 1*a* interposed therebetween. A terminal 11*c* of the switch 11 is electrically connected to the antenna ANT2 with the terminal 1*b* interposed therebetween.

The switch 11 selectively and electrically connects between the terminal 11*a* and the terminal 11*b* or between the terminal 11*a* and the terminal 11*c*.

The transmitting unit 22 is electrically connected to a terminal 12*a* of the switch 12 with the band pass filter 6 interposed therebetween. The receiving unit 23 is electrically connected to a terminal 12*b* of the switch 12 with the band pass filter 7 interposed therebetween. A terminal 12*c* of the switch 12 is electrically connected to the antenna ANT3 with the terminal 1*c* interposed therebetween.

The switch 12 selectively and electrically connects between the terminal 12*a* and the terminal 12*c* or between the terminal 12*b* and the terminal 12*c*.

The power amplifier 41 is electrically connected to a terminal 13*a* of the switch 13 with the band pass filter 8 interposed therebetween. The low noise amplifier 51 is electrically connected to a terminal 13*b* of the switch 13 with the band pass filter 9 interposed therebetween. The low noise amplifier 52 is electrically connected to a terminal 13*c* of the switch 13 with the band pass filter 10 interposed therebetween. A terminal 13*d* of the switch 13 is electrically connected to the antenna ANT4 with the terminal 1*d* interposed therebetween. A terminal 13*e* of the switch 13 is electrically connected to the antenna ANT5 with the terminal 1*e* interposed therebetween.

The switch 13 selectively and electrically connects between the terminal 13*a* and the terminal 13*d*, between the terminal 13*b* and the terminal 13*d*, or between the terminal 13*c* and the terminal 13*d*. The switch 13 also selectively and electrically connects between the terminal 13*a* and the terminal 13*e*, between the terminal 13*b* and the terminal 13*e*, or between the terminal 13*c* and the terminal 13*e*.

Effects

In the high-frequency module 1, the UWB circuit 3 and the UHB circuit 4 can be mounted on the single substrate 2. Accordingly, the high-frequency module 1 can reduce the mounting area of a communication device (e.g., mobile phone device), the size, and the cost.

Second Embodiment

Configuration

Figure 2:
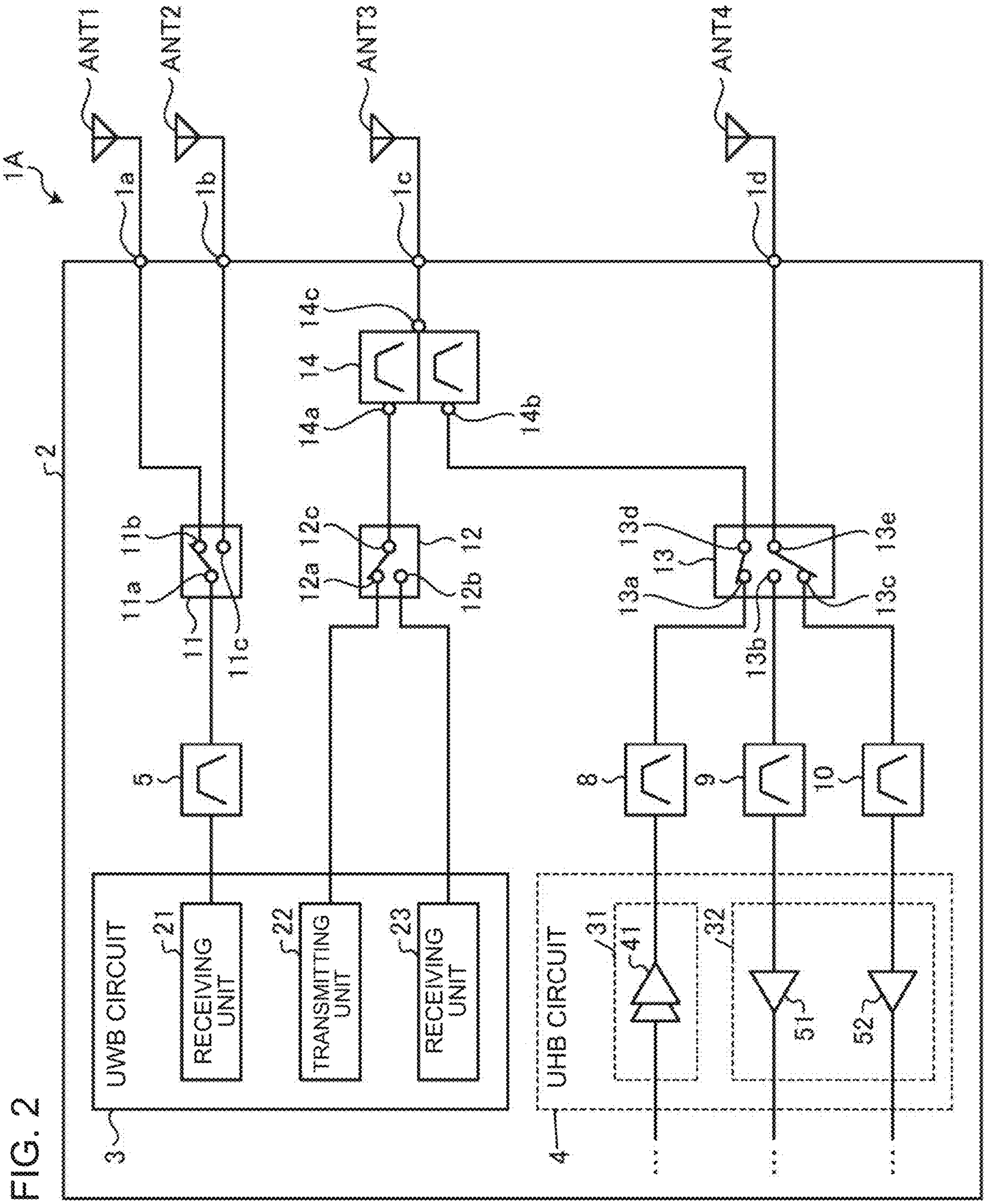
FIG. 2 is a diagram illustrating a configuration of a high-frequency module according to a second embodiment.

FIG. 2 is a diagram illustrating a configuration of a high-frequency module according to the second embodiment.

As compared with the high-frequency module 1 (see FIG. 1), a high-frequency module 1A does not include the band pass filter 6 or the band pass filter 7. Also, as compared with the high-frequency module 1, the high-frequency module 1A further includes a diplexer 14. In addition, as compared with the high-frequency module 1, the high-frequency module 1A does not have the terminal 1*e*. Therefore, the high-frequency module 1A does not require the antenna ANT5 (see FIG. 1).

The transmitting unit 22 is electrically connected to the terminal 12*a* of the switch 12. The receiving unit 23 is electrically connected to the terminal 12*b* of the switch 12. The terminal 12*c* of the switch 12 is electrically connected to a terminal 14*a* of the diplexer 14.

The terminal 13*d* of the switch 13 is electrically connected to a terminal 14*b* of the diplexer 14. The terminal 13*e* of the switch 13 is electrically connected to the antenna ANT4 with the terminal 1*d* interposed therebetween.

A terminal 14*c* of the diplexer 14 is electrically connected to the antenna ANT3 with the terminal 1*c* interposed therebetween.

The diplexer 14 band-passes a UWB signal that is input to the terminal 14*a* and outputs it from the terminal 14*c*. The diplexer 14 band-passes a UHB signal that is input to the terminal 14*b* and outputs it from the terminal 14*c*.

The diplexer 14 band-passes a UWB signal component in a high-frequency signal that is input to the terminal 14*c* and outputs it from the terminal 14*a*. The diplexer 14 band-passes a UHB signal component in a high-frequency signal that is input to the terminal 14*c* and outputs it from the terminal 14*b*.

That is, the antenna ANT3 is shared for the transmission and reception of UWB radio waves and the transmission and reception of UHB radio waves.

Effects

As compared with the high-frequency module 1, the high-frequency module 1A can reduce the number of band pass filters from six to four. In addition, as compared with the high-frequency module 1, the high-frequency module 1A can reduce the number of antennas from five to four.

Accordingly, the high-frequency module 1A can further reduce the mounting area of a communication device, the size, and the cost.

Third Embodiment

Configuration

Figure 3:
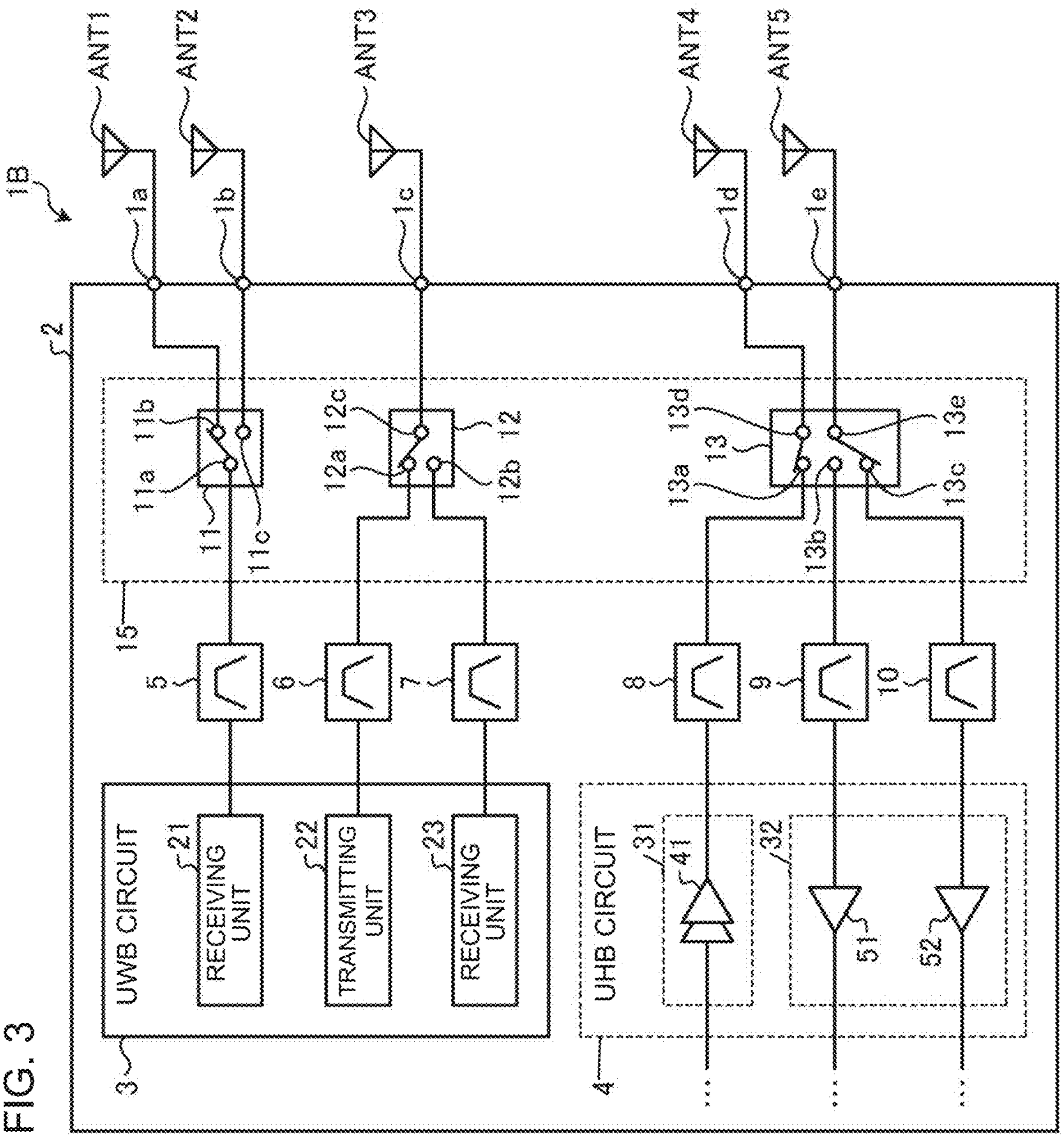
FIG. 3 is a diagram illustrating a configuration of a high-frequency module according to a third embodiment.

FIG. 3 is a diagram illustrating a configuration of a high-frequency module according to the third embodiment.

As compared with the high-frequency module 1 (see FIG. 1), in a high-frequency module 1B, a high-frequency switch 15 includes the switch 11, the switch 12, and the switch 13. The high-frequency switch 15 is formed in a single semiconductor device.

The switch 11 corresponds to an example of a "first switch" of the present disclosure. The switch 12 corresponds to an example of a "second switch" of the present disclosure. The switch 13 corresponds to an example of a "third switch" of the present disclosure.

Effects

In the high-frequency module 1B, the high-frequency switch 15 is formed in a single semiconductor device.

Accordingly, since the number of components can be reduced, the high-frequency module 1B can further reduce the mounting area of a communication device, the size, and the cost.

Combination with Second Embodiment

The third embodiment can be combined with the second embodiment. That is, in the high-frequency module 1A (see FIG. 2) according to the second embodiment, the switch 11, the switch 12, and the switch 13 may be replaced with the high-frequency switch 15.

Fourth Embodiment

Structure Example

Figure 4:
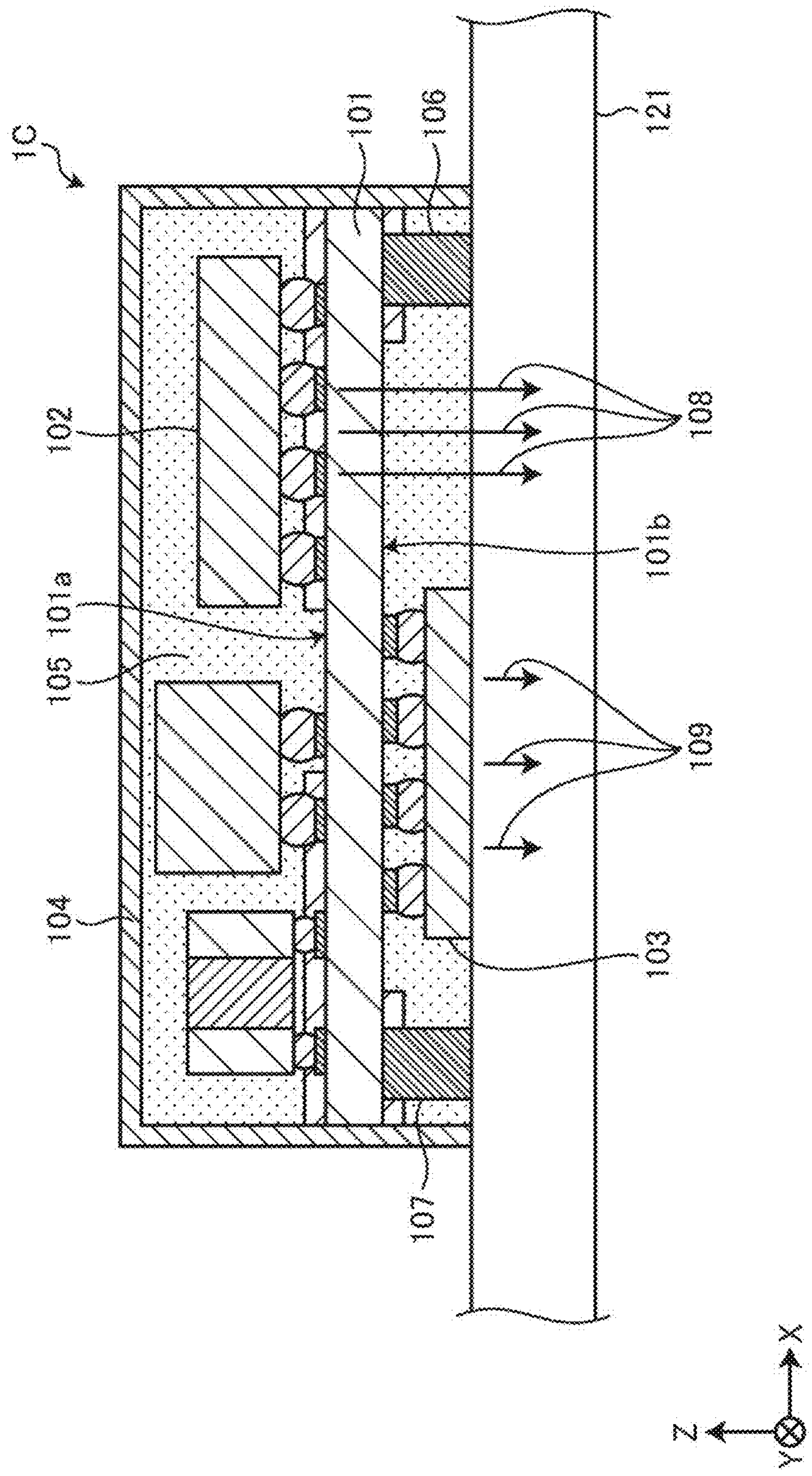
FIG. 4 is an explanatory diagram viewed in a direction parallel to a substrate of a high-frequency module according to a fourth embodiment.

FIG. 4 is an explanatory diagram viewed in a direction parallel to a substrate of a high-frequency module according to the fourth embodiment.

A high-frequency module 1C is mounted on a system substrate 121 of a communication device.

The high-frequency module 1C includes a substrate 101, a semiconductor device 102, a semiconductor device 103, a shield member 104, a filling member 105, a conductive member 106, and a conductive member 107.

In the semiconductor device 102, the power amplifier 41 (see FIG. 1 and the like) is formed. That is, the semiconductor device 102 is a semiconductor device including a GaAs substrate.

In the semiconductor device 103, the UWB circuit 3 (see FIG. 1 and the like) is formed. That is, the semiconductor device 103 is a semiconductor device including a Si substrate.

The substrate 101 extends along the X-Y plane.

A first main surface (main surface on Z-axis proximal end side) of the semiconductor device 102 is mounted on a first main surface 101*a* (main surface on Z-axis distal end side) of the substrate 101 with bumps, solder, or the like interposed therebetween. Examples of the bumps are pillar bumps, and copper (Cu) is used, for example. For each bump, in addition to copper, a low resistance metal material such as aluminum (Al) or gold (Au) may be used. Each bump may be, for example, a solder bump or a stud bump.

A first main surface (main surface on Z-axis distal end side) of the semiconductor device 103 is mounted on a second main surface 101*b* (main surface on Z-axis proximal end side) of the substrate 101 with bumps, solder, or the like interposed therebetween.

The first main surface 101*a* and four side surfaces of the substrate 101 are covered with the shield member 104.

An example of the shield member 104 is a metal. Examples of the metal include SUS (stainless steel) and copper, but the present disclosure is not limited thereto.

The shield member 104 shields the radiation of a high-frequency signal generated by the high-frequency module 1C.

A space between the shield member 104 and the substrate 101 and a space between the shield member 104 and the respective components are filled with the filling member 105. An example of the filling member 105 is a resin, but the present disclosure is not limited thereto.

The second main surface 101*b* and the system substrate 121 are electrically connected to each other with the conductive member 106 and the conductive member 107 interposed therebetween.

The first main surface (main surface on Z-axis distal end side) of the semiconductor device 103 is mounted on the substrate 101 and is electrically connected thereto. A second main surface (main surface on Z-axis proximal end side) of the semiconductor device 103 is in contact with the system substrate 121.

As indicated by arrows 108, heat generated by the semiconductor device 102 is conducted to the system substrate 121 through the substrate 101 and the filling member 105 in a direction opposite to the Z-axis direction.

As indicated by arrows 109, heat generated by the semiconductor device 103 is conducted from the second main surface of the semiconductor device 103 to the system substrate 121 in a direction opposite to the Z-axis direction.

Layout Example

Figure 5:
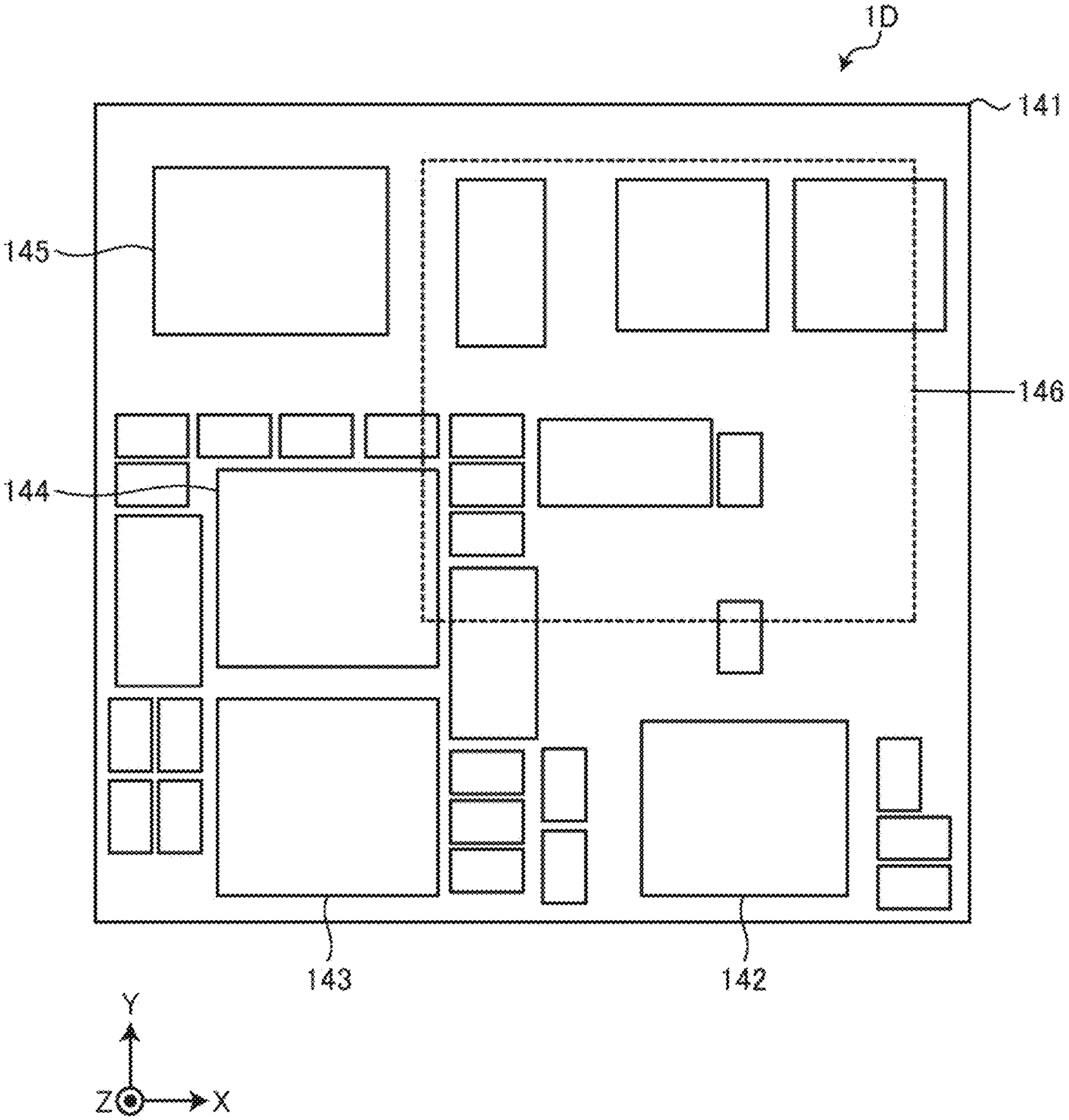
FIG. 5 is an explanatory diagram viewed in a direction perpendicular to a substrate of a high-frequency module according to the fourth embodiment.

FIG. 5 is an explanatory diagram viewed in a direction perpendicular to a substrate of a high-frequency module according to the fourth embodiment.

A high-frequency module 1D includes a substrate 141 and semiconductor devices 142 to 146.

In the semiconductor device 142, the power amplifier 41 (see FIG. 1 and the like) is formed. That is, the semiconductor device 142 is a semiconductor device including a GaAs substrate.

The semiconductor device 143 is a power amplifier controller for controlling the power amplifier 41 (semiconductor device 142).

In the semiconductor device 144, the low noise amplifier 51 and the low noise amplifier 52 (see FIG. 1 and the like) are formed. That is, the semiconductor device 144 is a semiconductor device including a Si substrate.

In the semiconductor device 145, the high-frequency switch 15 (see FIG. 3) is formed.

In the semiconductor device 146, the UWB circuit 3 (see FIG. 1 and the like) is formed. That is, the semiconductor device 103 is a semiconductor device including a Si substrate.

The substrate 141 extends along the X-Y plane.

The semiconductor device 142 is mounted on a first main surface (main surface on Z-axis distal end side, main surface on paper front side) of the substrate 141 on the X-axis distal end side and the Y-axis proximal end side.

The semiconductor device 143 is mounted on the first main surface (main surface on Z-axis distal end side, main surface on paper front side) of the substrate 141 on the X-axis proximal end side and the Y-axis proximal end side.

The semiconductor device 144 is mounted on the first main surface (main surface on Z-axis distal end side, main surface on paper front side) of the substrate 141 on the X-axis proximal end side and next to the semiconductor device 143 on the Y-axis distal end side.

The semiconductor device 145 is mounted on the first main surface (main surface on Z-axis distal end side, main surface on paper front side) of the substrate 141 on the X-axis proximal end side and the Y-axis distal end side.

The semiconductor device 146 is mounted on a second main surface (main surface on Z-axis proximal end side, main surface on paper back side) of the substrate 141 on the X-axis distal end side and the Y-axis distal end side.

Effects (1)

For example, if the UWB is set to 6 GHz to 8 GHZ, and the UHB is set to 3.3 GHZ to 5 GHz, a second harmonic wave of a UHB signal may affect the UWB circuit 3.

However, the semiconductor device 102 is mounted on the first main surface 101*a* of the substrate 101, and the semiconductor device 103 is mounted on the second main surface 101*b* of the substrate 101. In addition, the first main surface 101*a* and four side surfaces of the substrate 101 are covered with the shield member 104.

Accordingly, the high-frequency module 1C can suppress the harmonic wave at the time of transmission of the UHB signal affecting the UWB circuit 3. Therefore, in the high-frequency module 1C, the semiconductor device 102 (UWB circuit 3) and the semiconductor device 103 (UHB circuit 4) can be mounted on a single module while ensuring high isolation between the semiconductor device 102 and the semiconductor device 103.

(2)

The semiconductor device 102 (power amplifier 41) includes a GaAs substrate in consideration of high-frequency characteristics. Heat generated by the semiconductor device 102 is conducted through a path indicated by the arrows 108.

The semiconductor device 103 (UWB circuit 3) includes a Si substrate having a high thermal conductivity. In addition, the second main surface of the semiconductor device 103 is in contact with the system substrate 121. Heat generated by the semiconductor device 103 is conducted to the system substrate 121 through a path indicated by the arrows 109.

In the above manner, in the high-frequency module 1C, the conduction path (arrows 108) of the heat generated by the semiconductor device 102 and the conduction path (arrows 109) of the heat generated by the semiconductor device 103 are isolated from each other. Therefore, in the high-frequency module 1C, interaction (characteristics deterioration) between the semiconductor device 102 and the semiconductor device 103 due to heat can be suppressed.

Modification Example

The UWB circuit 3 is formed in the semiconductor device 103 in the fourth embodiment, but the present disclosure is not limited thereto. In the semiconductor device 103, a circuit for transmitting and receiving an LB (Low Band) signal may alternatively be formed. Examples of the LB are n5, n8, and n28 of 5G NR, and an example of the frequency band is 1 GHz or less. In this case, a fourth harmonic wave of the LB signal may affect the UHB circuit 4.

However, the semiconductor device 102 is mounted on the first main surface 101*a* of the substrate 101, and the semiconductor device 103 is mounted on the second main surface 101*b* of the substrate 101. In addition, the first main surface 101*a* and four side surfaces of the substrate 101 are covered with the shield member 104.

Accordingly, the high-frequency module 1C can suppress the harmonic wave at the time of transmission of the LB signal affecting the UHB circuit 4. Therefore, in the high-frequency module 1C, the semiconductor device 102 (UWB circuit 3) and the semiconductor device 103 (LB circuit) can be mounted on a single module while ensuring high isolation between the semiconductor device 102 and the semiconductor device 103.

Combination with Other Embodiments

The fourth embodiment can be combined with the first to third embodiments.

Fifth Embodiment

Configuration

Figure 6:
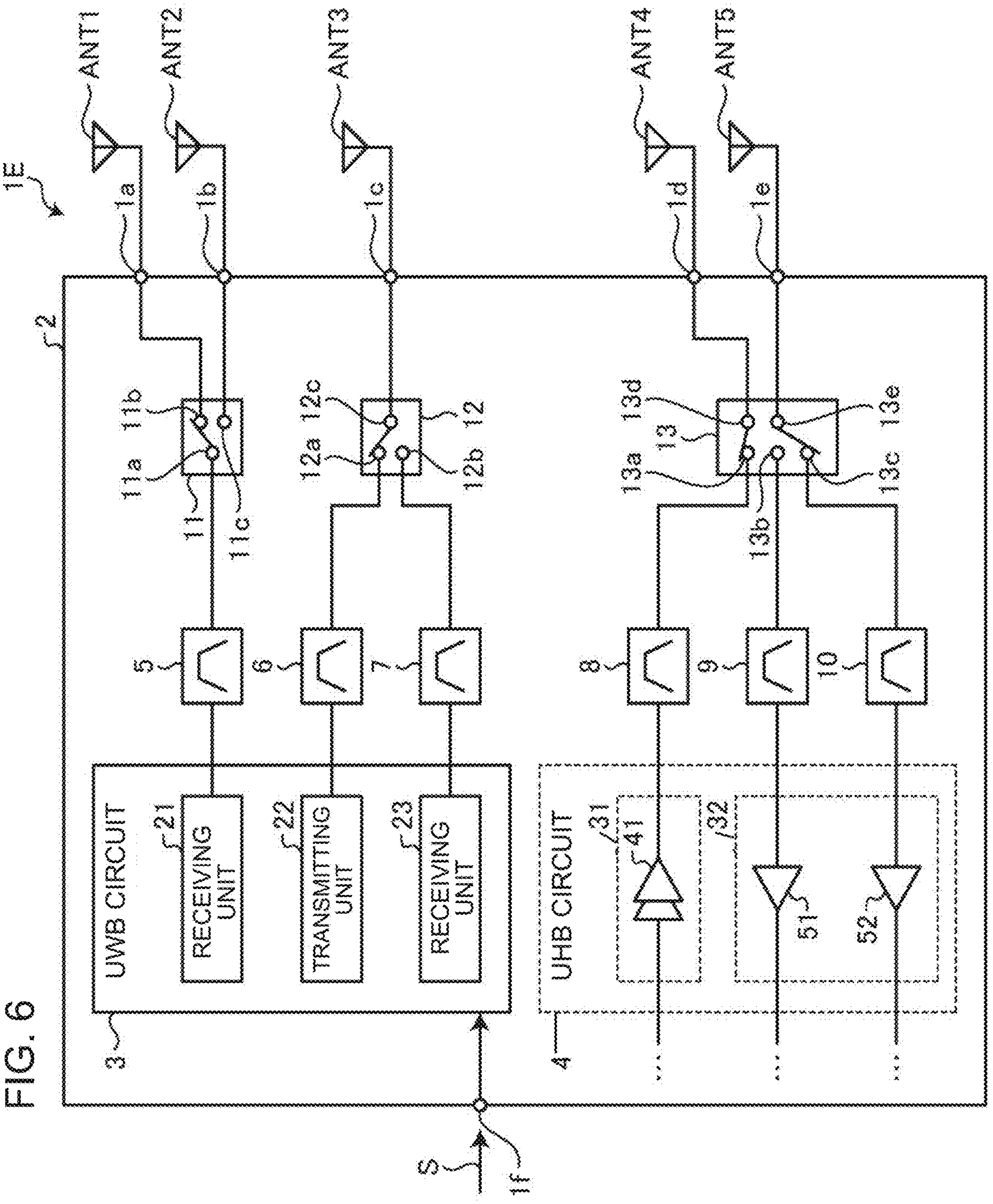
FIG. 6 is a diagram illustrating a configuration of a high-frequency module according to a fifth embodiment.

FIG. 6 is a diagram illustrating a configuration of a high-frequency module according to the fifth embodiment.

As compared with the high-frequency module 1 (see FIG. 1), in a high-frequency module 1E, the substrate 2 further includes a terminal 1*f*. The terminal 1*f* receives a timing signal S indicating a timing at which the UHB circuit 4 receives (DL: Down Link) a signal and a timing at which the UHB circuit 4 transmits (UL: Up Link) a signal. The timing signal S is input to the UWB circuit 3. The UWB circuit 3 operates in accordance with the timing signal S.

Operation Timings

Figure 7:
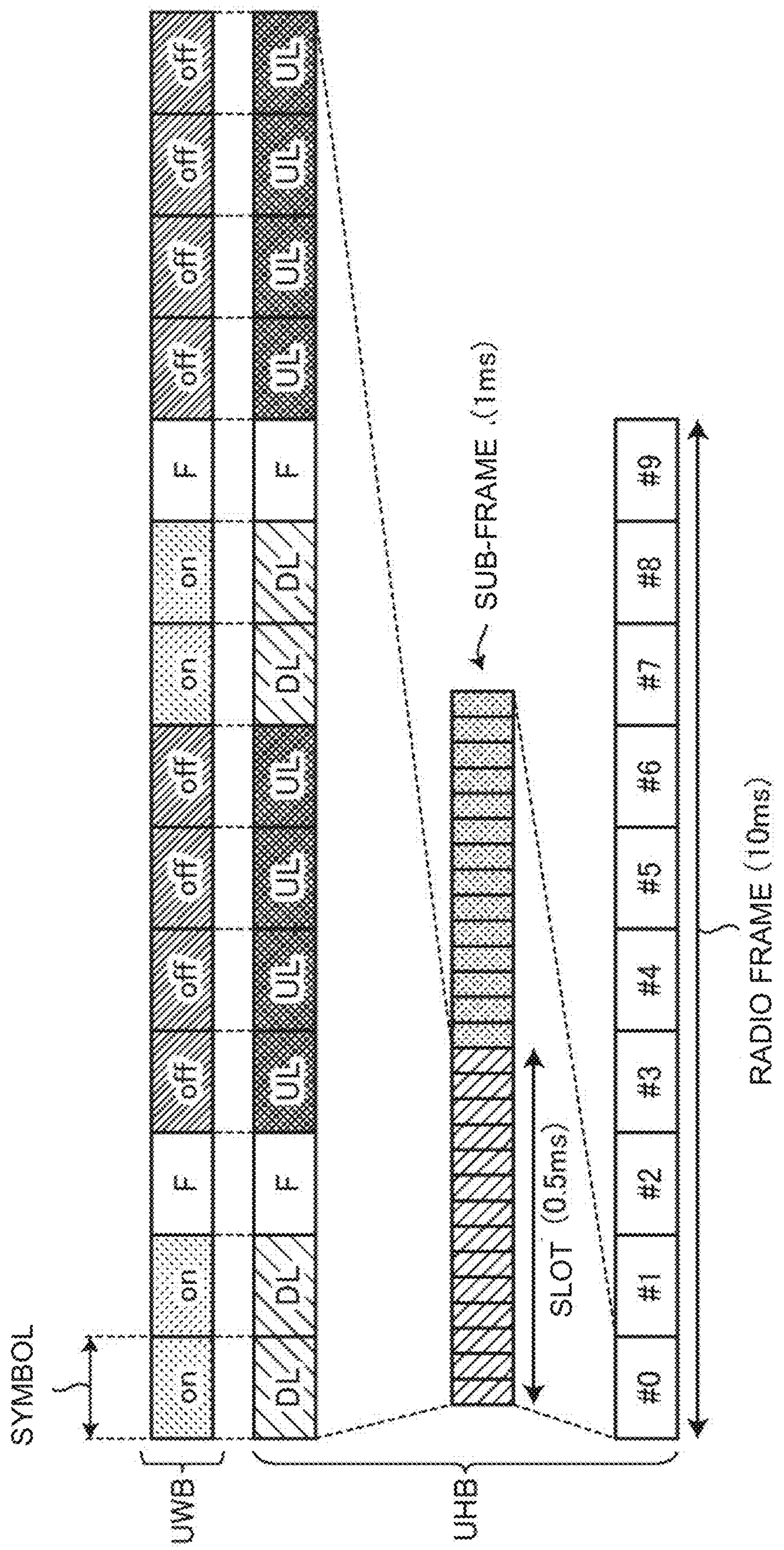
FIG. 7 is a diagram illustrating operation timings of the high-frequency module according to the fifth embodiment.

FIG. 7 is a diagram illustrating operation timings of the high-frequency module according to the fifth embodiment.

The UHB circuit 4 performs transmission and reception by using radio frames in units. As an example, one radio frame has a duration of 10 ms. One radio frame includes ten sub-frames. As an example, one sub-frame has a duration of 1 ms. One sub-frame includes two slots. As an example, one slot has a duration of 0.5 ms. One slot includes 14 symbols. There are three types of symbols: DL, F (Flexible) with no transmission or reception, and UL.

The UWB circuit 3 transmits and receives a signal (on) in a period (DL) during which the UHB circuit 4 is receiving a signal in accordance with the timing signal S. The UWB circuit 3 does not transmit or receive a signal (off) in a period (UL) during which the UHB circuit 4 is transmitting a signal in accordance with the timing signal S.

Effects

For example, if the UWB is set to 6 GHz to 8 GHZ, and the UHB is set to 3.3 GHZ to 5 GHZ, in the period (UL) during which the UHB circuit 4 is transmitting a signal, a second harmonic wave of a UHB signal may affect the UWB circuit 3.

Therefore, the UWB circuit 3 does not transmit or receive a signal (off) in the period (UL) during which the UHB circuit 4 is transmitting a signal.

In the period (DL) during which the UHB circuit 4 is receiving a signal, a second harmonic wave of a UHB signal is not generated.

Therefore, the UWB circuit 3 transmits and receives a signal (on) in the period (DL) during which the UHB circuit 4 is receiving a signal.

Accordingly, the high-frequency module 1E can suppress the harmonic wave at the time of transmission of the UHB signal affecting the UWB circuit 3. Therefore, the high-frequency module 1E can eliminate the restriction of the arrangement of the UWB circuit 3 and the UHB circuit 4. Also, in the high-frequency module 1E, the UWB circuit 3 and the UHB circuit 4 can be mounted on the single substrate 2. Accordingly, the high-frequency module 1E can reduce the mounting area of a communication device, the size, and the cost.

Modification Example

In the fifth embodiment, the UHB circuit 4 may be replaced with a transmission and reception circuit of another time division duplex (TDD: Time Division Duplex) method.

Combination with Other Embodiments

The fifth embodiment can be combined with the first to fourth embodiments.

Configuration Examples of Present Disclosure

The present disclosure may also employ the following configurations.

(1)

A high-frequency module including:

a first circuit configured to input and output a signal of a first frequency band;

a second circuit configured to input and output a signal of a second frequency band, the second frequency band being lower than the first frequency band;

a high-frequency switch;

a diplexer;

a first external connection terminal and a second external connection terminal, the first external connection terminal and the second external connection terminal being configured to receive signals received from a first antenna and a second antenna; and a third external connection terminal and a fourth external connection terminal, the third external connection terminal and the fourth external connection terminal being configured to receive signals received from a third antenna and a fourth antenna or transmit signals to the third antenna and the fourth antenna, in which a first receiving unit in the first circuit is selectively connected to either the first external connection terminal or the second external connection terminal with a band pass filter interposed therebetween and then with a first switch in the high-frequency switch interposed therebetween, a first transmitting unit or a second receiving unit in the first circuit is selectively connected with a second switch in the high-frequency switch interposed therebetween, and further, the second switch is connected to the diplexer connected to the third external connection terminal, a second transmitting unit in the second circuit is connected to the diplexer or the fourth external connection terminal with a third switch in the high-frequency switch interposed therebetween, and a third receiving unit or a fourth receiving unit in the second circuit is selectively connected to the fourth external connection terminal with the third switch interposed therebetween.

(2)

The high-frequency module according to (1), in which the high-frequency switch is formed in a single semiconductor device.

(3)

The high-frequency module according to (1) or (2), in which the first circuit, the second circuit, the high-frequency switch, and the diplexer are mounted on a single substrate.

(4)

The high-frequency module according to (3), in which the second transmitting unit in the second circuit is mounted on a first main surface of the substrate, and the first circuit is mounted on a second main surface of the substrate.

(5)

The high-frequency module according to (4), in which the third receiving unit and the fourth receiving unit in the second circuit are mounted on the first main surface of the substrate.

(6)

The high-frequency module according to (4), in which the third receiving unit and the fourth receiving unit in the second circuit are mounted on the second main surface of the substrate.

(7)

The high-frequency module according to any one of (4) to (6), in which the first main surface and four side surfaces of the substrate are covered with a shield member.

(8)

The high-frequency module according to any one of (4) to (7), in which the second main surface of the substrate is mounted on another substrate with a conductive member interposed therebetween, and the first circuit is in contact with the other substrate.

(9)

The high-frequency module according to any one of (1) to (8), in which the first circuit transmits and receives a signal in a period during which the second circuit is receiving a signal and does not transmit or receive a signal in a period during which the second circuit is transmitting a signal.

(10)

The high-frequency module according to any one of (1) to (9), in which the first frequency band is a UWB (Ultra Wide Band), and the second frequency band is a UHB (Ultra High Band).

It should be noted that the embodiments described above are intended to facilitate understanding of the present disclosure and are not intended to limit the present disclosure. The present disclosure can be modified/improved without necessarily departing from the gist thereof, and equivalents thereof are also included in the present disclosure.

What is claimed is:

1. A high-frequency module comprising:

a first circuit configured to input and output a first signal of a first frequency band;

a second circuit configured to input and output a second signal of a second frequency band, the second frequency band being different from the first frequency band;

a high-frequency switch comprising a plurality of switches;

a diplexer;

a first external connection terminal configured to receive signals from a first antenna;

a second external connection terminal configured to receive signals from a second antenna;

a third external connection terminal configured to receive signals from a third antenna or transmit signals to the third antenna; and a fourth external connection terminal, configured to receive signals from a fourth antenna or transmit signals the fourth antenna, wherein the first circuit comprises a first receiving unit, a first transmitting unit, and a second receiving unit, wherein the first receiving unit is configured to be selectively connected to either the first external connection terminal or the second external connection terminal via a band pass filter and a first switch of the plurality of switches, wherein the first transmitting unit or the second receiving unit are configured to be selectively connected to the third external connection terminal via a second switch of the plurality of switches and the diplexer, wherein the second circuit comprises a second transmitting unit, a third receiving unit, and fourth receiving unit, wherein the second transmitting unit is connected to the diplexer or the fourth external connection terminal via a third switch of the plurality of switches, and wherein the third receiving unit or the fourth receiving unit is configured to be selectively connected to the fourth external connection terminal via the third switch.

2. The high-frequency module according to claim 1, wherein the plurality of switches of the high-frequency switch is in a single semiconductor device.

3. The high-frequency module according to claim 1, wherein the first circuit, the second circuit, the high-frequency switch, and the diplexer are mounted on a single substrate.

4. The high-frequency module according to claim 3, wherein the second transmitting unit is mounted on a first main surface of the substrate, and wherein the first circuit is mounted on a second main surface of the substrate.

5. The high-frequency module according to claim 4, wherein the third receiving unit and the fourth receiving unit are mounted on the first main surface of the substrate.

6. The high-frequency module according to claim 4, wherein the third receiving unit and the fourth receiving unit are mounted on the second main surface of the substrate.

7. The high-frequency module according to claim 4, wherein the first main surface and four side surfaces of the substrate are covered with a shield.

8. The high-frequency module according to claim 4, wherein the second main surface of the substrate is mounted on a second substrate with a conductive member interposed between the second main surface and the second substrate, and wherein the first circuit is in contact with the second substrate.

9. The high-frequency module according to claim 1, wherein the first circuit is configured to transmit and receive a signal in a period during which the second circuit is configured to receive a signal, and wherein the first circuit is configured to not transmit or receive a signal in a period during which the second circuit is configured to transmit a signal.

10. The high-frequency module according to claim 1, wherein the first frequency band is an Ultra Wide Band (UWB) band, and wherein the second frequency band is an Ultra High Band (UHB) band.

* * * * *